United States Patent [19]

Oudille et al.

[11] Patent Number: 5,471,134
[45] Date of Patent: Nov. 28, 1995

[54] MEASURING APPARATUS WITH ADJUSTABLE INDICATOR FOR MEASURING THE REAL LOAD FACTOR ON AN ELECTRICITY SOURCE

[75] Inventors: Jean-Claude Oudille, Joue Les Tours; Antonio Veiga, Tours, both of France

[73] Assignee: Saft, Romainville, France

[21] Appl. No.: 980,970

[22] Filed: Nov. 24, 1992

[30] Foreign Application Priority Data

Nov. 26, 1991 [FR] France .................................. 91 14558

[51] Int. Cl.[6] ........................... G01R 19/00; G01R 27/00
[52] U.S. Cl. ..................... 324/103 P; 324/102; 324/94
[58] Field of Search ...................... 307/351; 324/103 P, 324/102, 57 R, 103, 121

[56] References Cited

U.S. PATENT DOCUMENTS

| | | | |
|---|---|---|---|
| 4,333,049 | 6/1982 | Yui et al. | 324/102 |
| 4,639,618 | 1/1987 | Oleson | 307/351 |
| 4,884,019 | 11/1989 | McKee, Jr. | |
| 5,237,493 | 8/1993 | Durig et al. | 363/73 |

FOREIGN PATENT DOCUMENTS

| | | |
|---|---|---|
| 1638488 | 6/1970 | Germany . |
| 1588373 | 12/1970 | Germany . |
| 3728163 | 3/1989 | Germany . |

OTHER PUBLICATIONS

Radio Fernsehen Elektronik, vol. 35, No. 11, 1986, Berlin, Germany, p. 735; W. Michel: "Digitaler Spitzenwertmesser".

Primary Examiner—Kenneth A. Wieder
Assistant Examiner—Barry C. Bowser
Attorney, Agent, or Firm—Sughrue, Mion, Zinn, Macpeak & Seas

[57] ABSTRACT

The invention relates to measuring apparatus for measuring the real load factor on an electricity source delivering an AC current to a consumer appliance, said apparatus comprising:

a current sensor supplying a signal that is continuously proportional to the current delivered by the source;

a rectifier circuit receiving said signal and supplying a rectified signal;

a peak detector circuit receiving the rectified signal and extracting therefrom the peak value, which peak value can be read on an indicator; and calibration means enabling the measuring apparatus to be set so that the peak value indicator displays 100% when the measured peak value of the AC current reaches the specified maximum level.

7 Claims, 2 Drawing Sheets

MEASURING APPARATUS WITH ADJUSTABLE INDICATOR FOR MEASURING THE REAL LOAD FACTOR ON AN ELECTRICITY SOURCE

The present invention relates to measuring apparatus for measuring the real load factor on an electricity source delivering an AC current to a consumer appliance.

BACKGROUND OF THE INVENTION

The load factor on an AC current source is usually evaluated by measuring the r.m.s. value of the power or of the current which is taken from it by the user appliance, and by comparing the result of the measurement with the maximum value of the corresponding magnitude as specified in the nominal characteristics of the source.

Although that type of measurement is suitable when the source delivers to a purely resistive load, it is not suitable when the load is a "distorting" load, i.e. having a non-linear characteristic (e.g. a load including an input stage constituted by a rectifier bridge feeding a filtering capacitor). In such a case, the peak value of the current is significantly greater than what the peak value would be for an equivalent non-distorting load, i.e. equal to the r.m.s. value multiplied by √2, whereas the peak current may be 2 to 5 times greater than the r.m.s. value if the load is a distorting load. Comparing the r.m.s. values therefore leads to false conclusions which cause the real load on the source to be considerably under-estimated.

Such systematic error cannot be detected by the conventional measuring apparatus with which the source and the user appliance loading the source may be provided, and poses serious drawbacks. Not only is the real load factor on the source not known, but if the intrinsic limit of the source is exceeded at certain times, the reliability of the system is affected, and it may behave wrongly, e.g. it may start limiting, it may cut out, or it may switch over to a back-up system.

An object of the present invention is to remedy those drawbacks, and to make it possible to measure the real load factor on a source, the real load factor being defined as being equal to the ratio between the peak value of the current delivered and the limit value of that one of the nominal characteristics of the source which is specified as being limiting.

SUMMARY OF THE INVENTION

To this end, the invention provides measuring apparatus comprising:

a current sensor supplying a signal that is continuously proportional to the current delivered by the source;

a rectifier circuit receiving said signal and supplying a rectified signal;

a peak detector circuit receiving the rectified signal and extracting therefrom the peak value, which peak value can be read on an indicator; and calibration means enabling the measuring apparatus to be set so that the peak value indicator displays 100% when the measured peak value of the AC current reaches the specified maximum level.

By measuring peak values, such apparatus supplies a continuous indication of the instantaneous maximum value of the current flowing through the current sensor, regardless of the waveform (however far removed from a sine wave) of the current as a function of time. The peak value, i.e. the value that the source must actually deliver, is presented by the indicator in the form of a percentage (real load as a percentage of the maximum load of the source) independently of the degree of distortion imparted to the current by the user appliance loading the source.

In practice, the current sensor may be constituted either by a shunt resistor through which the current to be measured passes, or by a current transformer looped through a shunt resistor, the latter solution offering the advantage of providing electrical isolation between the measuring apparatus and the source.

It is advisable for the rectifier circuit to be chosen to be of the "no threshold" type so as to eliminate the systematic error which would be introduced by an ordinary rectifier having a threshold in the vicinity of the zero level. It is also preferable for the rectifier to be designed to provide full-wave rectification. In an advantageous embodiment, the rectifier circuit comprises a half-wave rectifier followed by a summing circuit adding half of its input signal to its output signal.

The peak detector circuit may include a comparator-amplifier whose output is connected via a diode to a capacitor having a resistor connected in parallel therewith, one input of the comparator-amplifier receiving the signal from the rectifier, and its other input being connected to said capacitor via a unity-gain amplifier.

By using measuring apparatus such as the above-defined apparatus with a source supplying electrical energy, it is possible to measure the real load factor on the source accurately, to verify and optionally to correct its nominal energy rating, to increase its reliability, and to facilitate use of the source.

BRIEF DESCRIPTION OF THE DRAWINGS

An embodiment of the invention is described by way of example with reference to the accompanying drawings, in which.

DETAILED DESCRIPTION

Figure 1:
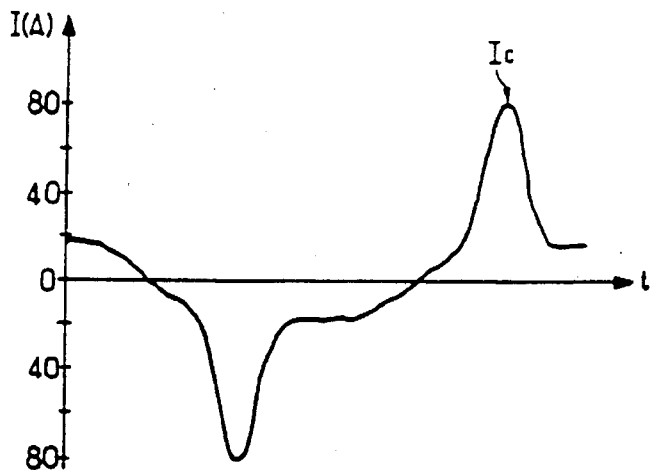
FIG. 1 is an example of how the current taken by a "distorting" user appliance changes as a function of time.

FIG. 1 shows how the current delivered by an AC electricity source, such as an inverter system (made up of a plurality of modules), to a distorting load may change as a function of time. Although a conventional ammeter passing the current gives a reading of 35 A, the peak value Ic is much higher, reaching 80 A, and, without the user knowing, it may exceed the limit value of peak current that can be delivered by the inverter. Such an abnormal situation may give rise to operating problems, and it can be detected by measuring the peak value of the current and comparing it to the limit value applicable to the source.

Figure 2:
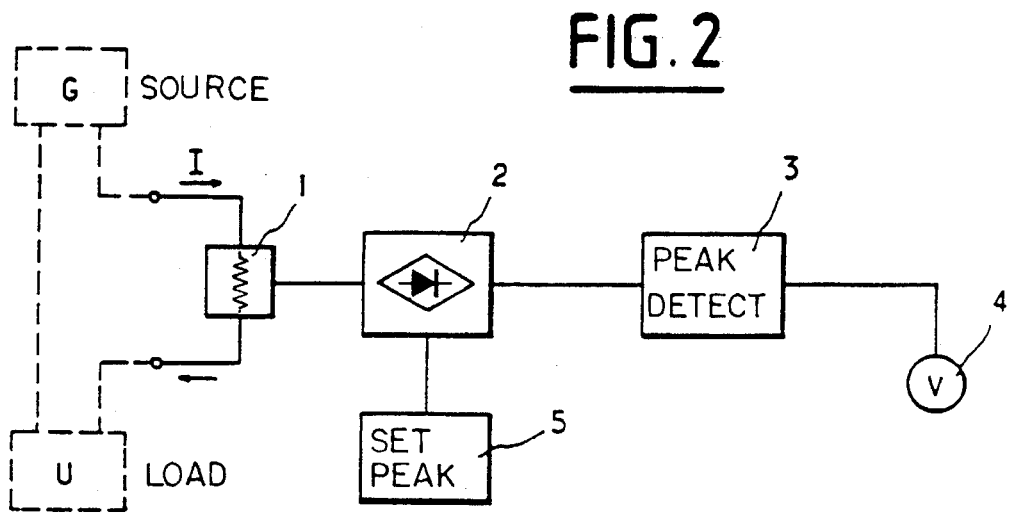
FIG. 2 shows the general structure of measuring apparatus of the invention.

The measurement may be taken by means of apparatus whose general structure is shown in FIG. 2. The measuring apparatus is connected in series between a source G and a user appliance U, and it includes a current sensor 1 passing the current I whose peak value is to be determined, which sensor supplies an AC signal whose voltage is proportional, at all times, to said current. In the preceding example, the voltage of the signal changes in the same way as the current whose variations are shown in FIG. 1. The AC signal supplied by the sensor 1 is applied to a full-wave rectifier 2 which supplies a rectified signal made up of same-polarity alternations, the amplitudes of the alternations corresponding to the amplitudes of the positive and of the negative alternations of the signal output by the sensor 1. The rectified signal is received by a peak detector 3 which outputs a DC signal whose amplitude corresponds to the peak value of the rectified signal, and is displayed by an indicator 4 such as a voltmeter. Calibration means 5 are also provided to enable the apparatus to be set so that the indicator displays 100% when the peak value of the current I reaches the limit value of the instantaneous current that can be supplied by the source used in each specific case.

Figure 3:
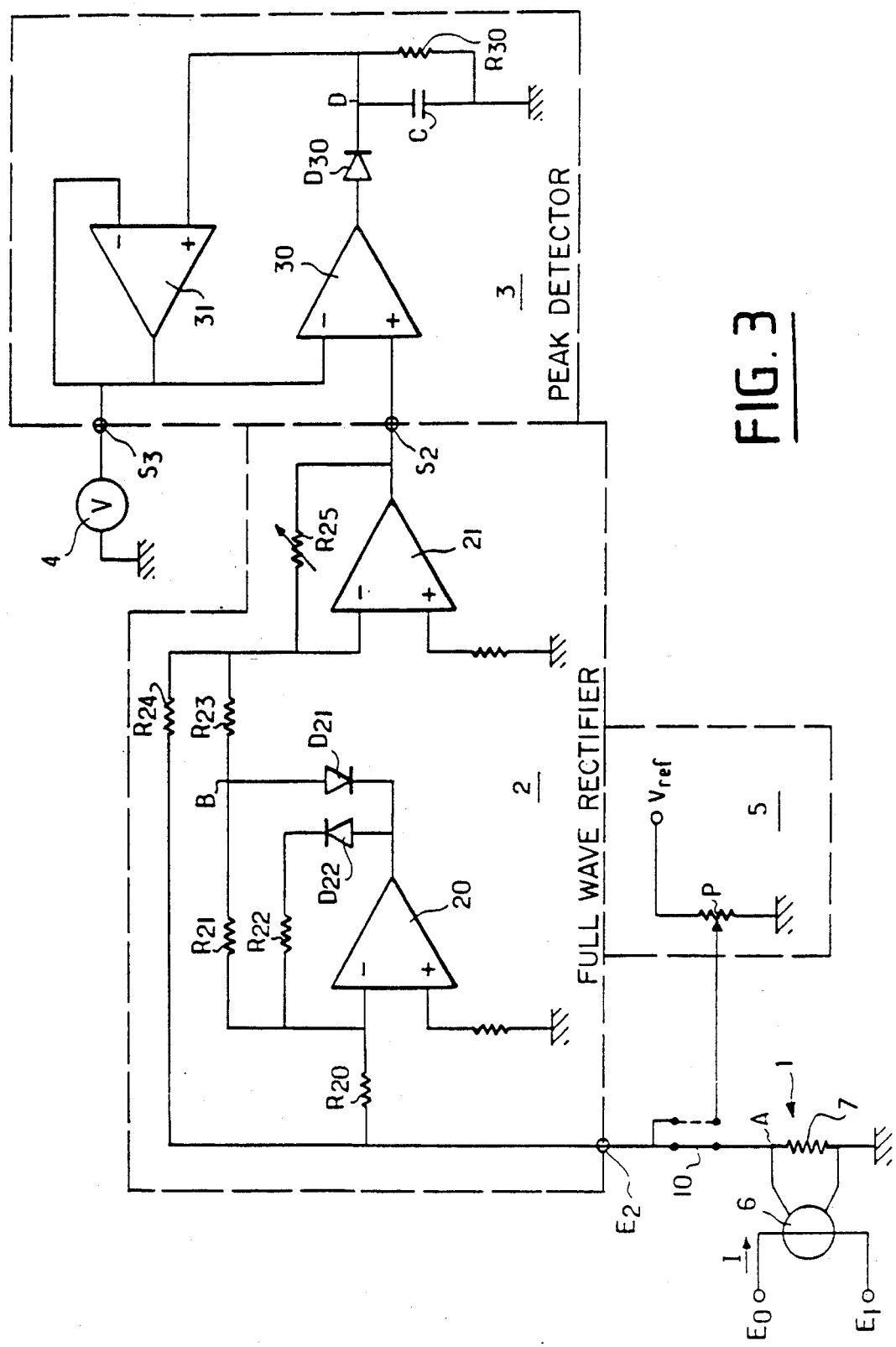
FIG. 3 is a detailed circuit diagram of the FIG. 2 apparatus.

In FIG. 3, the sensor 1 includes a stepdown current transformer 6 having its primary winding connected to input terminals $E_0$, $E_1$ enabling it to be inserted into the power circuit of the electricity source, and having its secondary winding connected to a shunt resistor 7, i.e. to a low-resistance resistor, at whose terminals a voltage signal $V_A$ is developed which is representative of the current I flowing through the primary winding. The signal $V_A$ is available at the terminal A of the shunt resistor 7 whose other terminal is connected to equipment ground. In a variant, the transformer 6 may be omitted, with the current I being injected directly into the shunt resistor 7 which then likewise supplies the above-mentioned signal $V_A$. However, the isolation provided by the transformer 6 between the power circuit and the measuring device no longer exists, and this may be a drawback.

The terminal A of the shunt resistor 7 is connected to the input $E_2$ of the full-wave rectifier 2 via a switch 8. The rectifier is of the "no threshold" type, i.e. the threshold above which it starts to supply an output voltage when the input voltage passes above zero is equal to zero. The rectifier includes two operational amplifiers 20, 21. The inverting input of the first amplifier 20 is connected to the input $E_2$ via a resistor $R_{20}$, and to the output S of the first amplifier via a resistor $R_{21}$ in series with a diode $D_{21}$, and via a resistor $R_{22}$ in series with a diode $D_{22}$. The two diodes are connected in opposite directions, the diode $D_{21}$ being connected to the output S via its cathode, and the diode $D_{22}$ being connected to the output S via its anode. The inverting input of the second amplifier 21 is connected to a point B that is common to the resistor $R_{21}$ and to the diode $D_{21}$ via a resistor $R_{23}$, and to the input $E_2$ of the rectifier 2 via a resistor $R_{24}$. The amplifier 21 is also looped via a variable resistor $R_{25}$ connected between its inverting input and its output, which output constitutes the output $S_2$ of the rectifier 2. The above-mentioned resistors are chosen such that their resistances satisfy the following relationships:

$$R_{20}=R_{21}=R_{22}=R_{23}=\tfrac{1}{2}R_{24}$$

The peak detector 3 includes a first operational amplifier 30 whose non-inverting input is connected to the output $S_2$ of the rectifier 2, and whose output is connected to the anode of a diode $D_{30}$ whose cathode is connected to one of the terminals of a capacitor C whose other terminal is connected to ground. A resistor $R_{30}$ is connected in parallel with the capacitor. A point D common to the diode $D_{30}$, to the capacitor C, and to the resistor $R_{30}$ is connected to the non-inverting input of the second amplifier 31 which is a looped, unity gain amplifier, and whose output $S_3$ is connected both to the inverting input of the first amplifier 30, and to a voltmeter 4 displaying the voltage present at the output of the amplifier 31.

Figure 4:
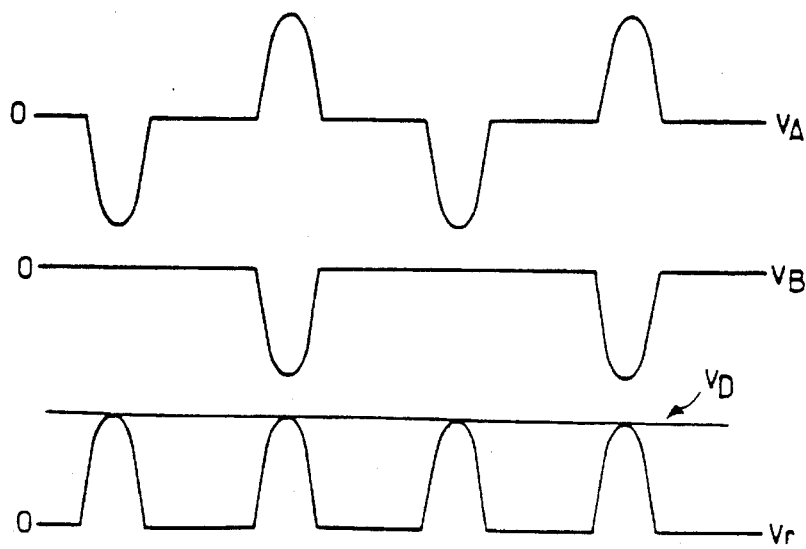
FIG. 4 shows the waveforms which may be observed at various points of the circuit shown in FIG. 3.

When an AC current (sinusoidal or distorted) is applied to the transformer 6 via its inputs $E_0$, $E_1$, a voltage signal $V_A$ of similar waveform (FIG. 4) appears at the point A, which signal is made up of positive and negative alternations, and is transmitted to the input $E_2$ of the rectifier 2. In the presence of positive alternations, the diode $D_{21}$ associated with the amplifier 20 conducts while the diode $D_{22}$ does not conduct. As a result, the gain of the amplifier measured between the points $E_2$ and B is equal to $-1$, and said alternations are merely inverted at the point B. In the presence of negative alternations, the diode $D_{22}$ conducts and the diode $D_{21}$ does not. The point B is therefore isolated from the output S of the amplifier 20 and its potential is then equal to the potential of the inverting input, i.e. zero. Therefore, the negative alternations do not appear at the point B. Thus, the signal $V_B$ which appears at the point B is as shown in FIG. 4. Given that the resistance of the resistor $R_{23}$ connected to the point B is half the resistance of the resistor $R_{24}$ connected to the input $E_2$, the amplifier 21 outputs the following signal:

$$Vr=-k(2V_B+V_A)$$

where k is a positive constant depending on the resistance given to the variable resistor $R_{25}$. As shown in FIG. 4, the waveform of the signal Vr is that of a signal having been subjected to full-wave rectification.

The rectified signal Vr is applied to the peak detector 3 where it charges the capacitor C via the amplifier 30 and via the diode $D_{30}$. The resulting voltage $V_D$ on the capacitor is identical to the voltage on the inverting input of the amplifier 30 as applied via the unity-gain amplifier 31. Between each period during which the capacitor C is charged under the effect of the alternations of the signal Vr, the capacitor discharges slowly through the resistance $R_{30}$ (with a time constant of about a few seconds). As a result, when the signal Vr is greater than the signal $V_D$, the amplifier supplies a positive output voltage which charges the capacitor via the diode $D_{30}$ which is made conductive. When the signal Vr is less than the signal $V_D$, the amplifier 30 outputs a negative voltage which prevents the diode $D_{30}$ from conducting, so that the capacitor C continues to discharge through the resistor $R_{30}$, the voltage of the signal $V_D$ decreasing slowly until it becomes lower than the peak voltage of the signal Vr, at which point the capacitor C starts to be charged again. By means of the charging and discharging that results from comparing the respective levels of the signals Vr and $V_D$, the voltage of the signal $V_D$ at the terminals of the capacitor C varies within narrow limits around the peak value of the signal Vr, which peak value is proportional to the peak value (assumed to be varying slowly) of the current I injected into the input of the apparatus. As a result, the voltmeter 4 connected at the output $S_3$ of the amplifier 31 and therefore measuring the voltage of the signal $V_D$ indicates a value that is proportional to the peak value of the current I. The value may be indicated as a percentage, the 0% graduation corresponding to a current I of zero, and therefore to a zero load factor on the source, and the 100% graduation corresponding to a current I whose peaks reach their maximum level compatible with the characteristics of the source, and therefore with the maximum load factor thereof.

The calibration means 5 comprise a potentiometer P to which a very stable reference voltage Vref is applied, the reference voltage being supplied by a special circuit that is not shown. By means of the switch 8, the input $E_2$ of the rectifier 2 can be connected either to the point A so as to measure the peak current, or to the slider of the potentiometer P for calibration purposes. For calibration purposes, the potentiometer P is set so that the voltage at the point $E_2$ is equal to the peak voltage which would appear at the point A if the electricity source used were to deliver the maximum peak current that it is capable of supplying. The variable resistor $R_{25}$ is then set so that the gain of the amplifier 21 can be adjusted so that the voltmeter displays its maximum value (100%). The point $E_2$ is then connected to the point A by operating the switch 8, and measuring the load factor on the source can then begin.

I claim:

1. A measuring apparatus for measuring the real load factor on an electricity source delivering an AC current to a consumer appliance;

wherein the apparatus comprises:

a current sensor supplying a signal that is continuously proportional to the current delivered by the source;

a rectifier circuit receiving said signal and supplying a rectified signal;

a peak detector circuit receiving the rectified signal and extracting therefrom the peak value;

an indication means for displaying a percentage value comprised between 0% and 100%; and means for adjusting the gain of the measuring apparatus so that the indication means displays 100% when the measured peak value reaches a specified maximum level which is the highest peak intensity which can be supplied by the source.

2. Apparatus according to claim 1, wherein the current sensor is constituted by a shunt resistor through which the current to be measured passes.

3. Apparatus according to claim 1, wherein the current sensor is constituted by a current transformer looped through a shunt resistor.

4. Apparatus according to claim 1, wherein the rectifier circuit is of the "no threshold" type.

5. Apparatus according to claim 1, wherein the rectifier provides full-wave rectification.

6. Apparatus according to claim 5, wherein the rectifier circuit comprises a half-wave rectifier followed by a summing circuit adding half of its input signal to its output signal.

7. Apparatus according to claim 1, wherein the peak detector circuit includes a comparator-amplifier whose output is connected via a diode to a capacitor having a resistor connected in parallel therewith, one input of the comparator-amplifier receiving the signal from the rectifier, and its other input being connected to said capacitor via a unity-gain amplifier.

* * * * *